(12) United States Patent
Prophet

(10) Patent No.: US 6,788,175 B1
(45) Date of Patent: Sep. 7, 2004

(54) ANCHORS FOR MICRO-ELECTRO-MECHANICAL SYSTEMS (MEMS) DEVICES

(75) Inventor: Eric M. Prophet, Santa Barbara, CA (US)

(73) Assignee: Superconductor Technologies, Inc., Santa Barbara, CA (US)

( * ) Notice: Subject to any disclaimer, the term of this patent is extended or adjusted under 35 U.S.C. 154(b) by 0 days.

(21) Appl. No.: 09/972,033

(22) Filed: Oct. 4, 2001

(51) Int. Cl.[7] .............................................. H01H 51/22
(52) U.S. Cl. ........................................ 335/78; 200/181
(58) Field of Search ..................... 335/78–86; 200/181; 257/414–427, 532; 381/233; 333/262

(56) References Cited

U.S. PATENT DOCUMENTS

| 5,583,291 A | 12/1996 | Gutteridge et al. |
| 5,992,233 A | 11/1999 | Clark |
| 6,146,543 A | 11/2000 | Tai et al. |

FOREIGN PATENT DOCUMENTS

| JP | 10-320288 | 12/1998 | ........... G06F/12/14 |

OTHER PUBLICATIONS

Booklet—An Investigation of MEMS Anchor Design for Optimal Stiffness & Damping—Daniel R. Sherman, 1996, no month.

Booklet—Optimal Design of SOI Anchor—Wenjiang Chen, 1999, no month.

Lecture Notes: An Investigation of MEMS Anchor Design for Optimal Stiffness & Damping—Daniel R. Sherman, BSAC, Feb. 22, 1996.

Thesis—Design, Analysis and Febrication of Surface–Micromachined Beam Without Step–Up Spring Effect; Lan Vy Ngo, 1996, no month.

Surface–Micromachined Beams Without Spring Effect of Anchor Step–Up—Lan V. Ngo, Phyllis Nelson, Chang–Jin Kim, Jun. 1996, no month.

Patent Abstracts of Japan 10-320288 Dec. 4, 1998.

*Primary Examiner*—Lincoln Donovan
(74) *Attorney, Agent, or Firm*—O'Melveny & Myers LLP

(57) ABSTRACT

The present invention provides an anchor system for securing a MEMS device to a substrate comprising multiple anchors. A MEMS structure, built in accordance with the one embodiment of the invention, comprises a flexible beam suspended over a substrate and a base attached to each end of the beam. Each base is supported above the substrate by multiple anchors attached to the surface of the substrate. Each anchor further comprises anchor legs along its sides that support the base off of the substrate. In one embodiment, the anchors of each base are located away from the interface between the beam and the base. In another embodiment, the lengths of the anchor legs of the anchors are made longer along a direction of good side-wall step coverage than along a direction of poor side-wall step coverage.

25 Claims, 8 Drawing Sheets

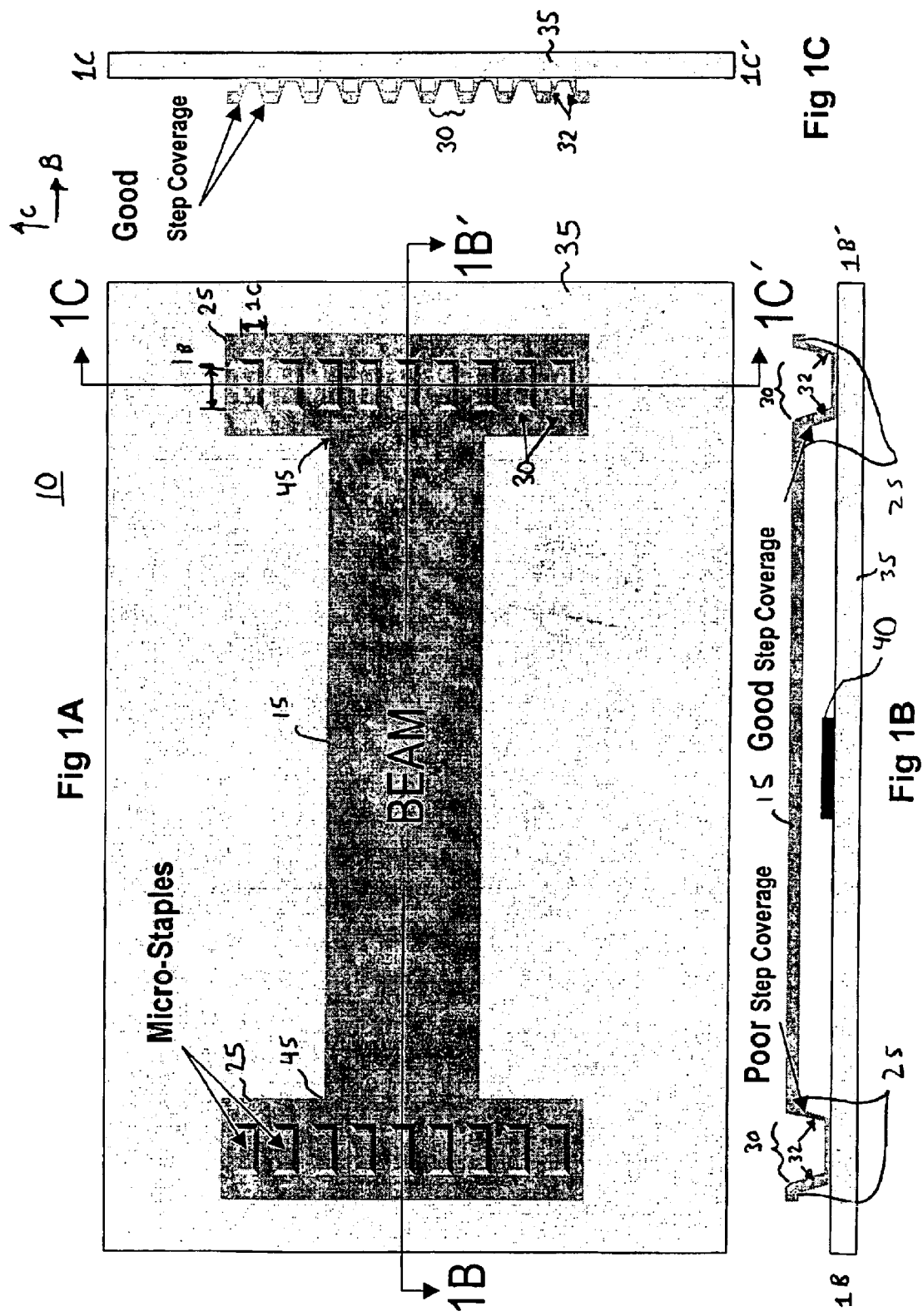

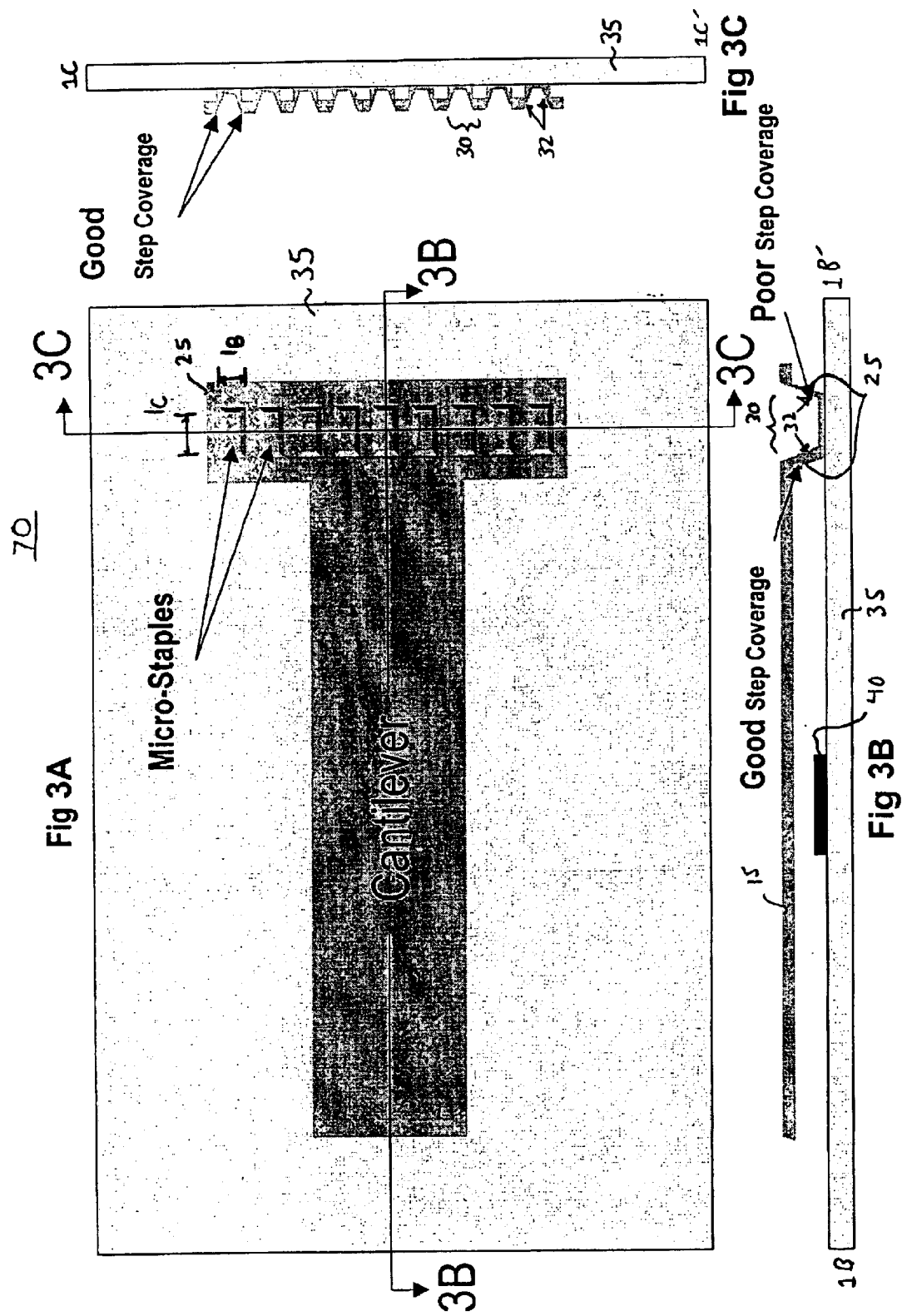

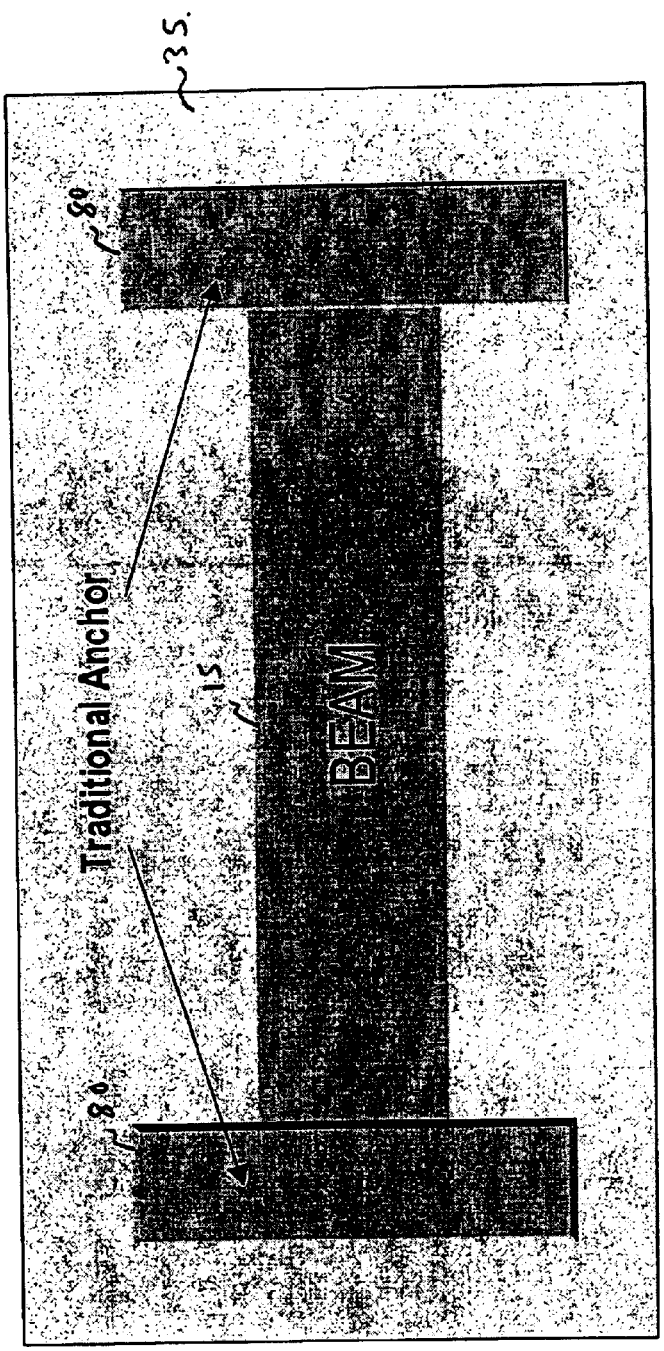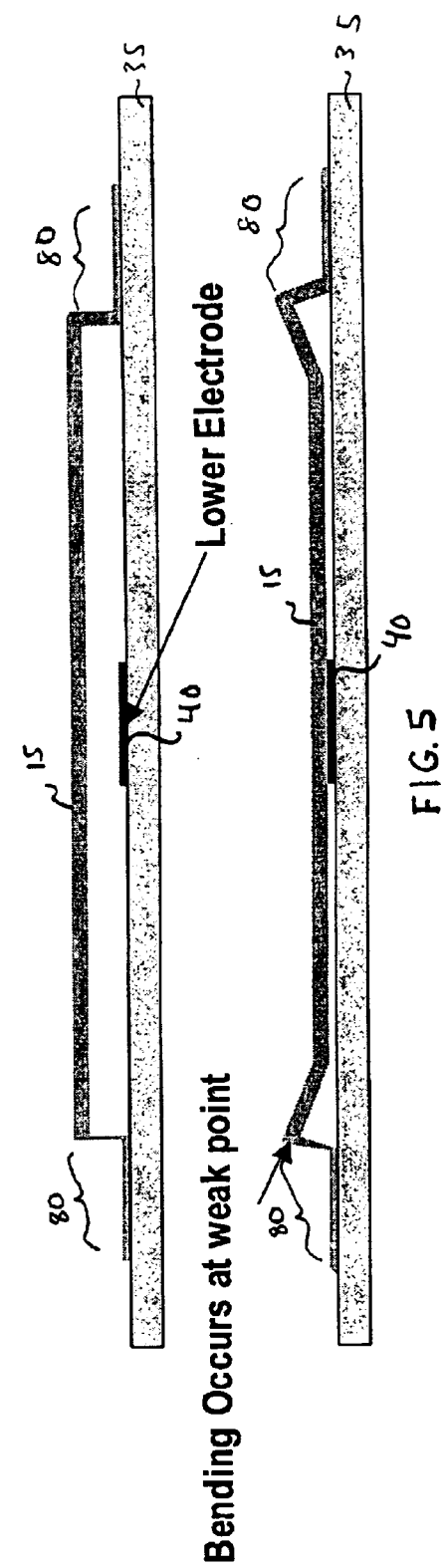
FIG. 5 ns (MEMS) DEVICES

TECHNICAL FIELD

The invention relates to anchors for securing a device to a substrate, and more particularly to anchors for securing a Micro-Electro-Mechanical Systems (MEMS) device to a substrate.

BACKGROUND OF THE INVENTION

Micro-Electro-Mechanical System (MEMS) devices find applications in a variety of fib fields, such as communications, sensing, optics, micro-fluidics, and measurements of material properties. In the field of communications, MEMS Radio Frequency (RF) switches and variable MEMS capacitors are used in tunable RF filter circuits. The MEMS RF switches and MEMS capacitors offer several advantages over solid state varactor diodes, including a higher on/off capacitance ratio and higher Quality (Q) factor.

A MEMS device is typically secured to a substrate by an anchor. The "footprint" area of a traditional anchor is maximized with respect to a set of design rules and process constraints to assure proper adhesion of the MEMS device to the substrate. The anchor must be strong enough to withstand stress exerted on the anchor by bending or flexing of the MEMS device. A drawback of the traditional anchor is that the strength of the anchor is increased by increasing the "footprint" area of the anchor, which has the undesirable affect of increasing the overall size of the MEMS device, or otherwise places additional design constraints on the MEMS device. Another drawback is that a single fracture in the traditional anchor can propagate along the length of the anchor resulting in mechanical failure of the anchor.

SUMMARY OF THE INVENTION

The present invention provides an anchor system for securing the base of a MEMS device to a substrate comprising multiple anchors instead of a traditional anchor that maximizes the "footprint" area of the anchor. By segmenting the anchor system into multiple smaller anchors, the invention is able to increase the overall strength of the anchor system.

A MEMS structure, built in accordance with one embodiment of the invention, comprises a flexible beam suspended over a substrate and a base attached to each end of the beam. Each base is supported above the substrate by multiple anchors attached to the surface of the substrate. Each anchor further comprises anchor legs along its sides that support the respective base off of the substrate.

In one embodiment, the anchors of each base are located away from the interface between the beam and the base. This is done so that stress due to bending or flexing of the beam occurs away from the anchors, thereby making the anchors less prone to mechanical failure.

In another embodiment, the lengths of the anchor legs of the anchors are made longer along a direction of good side-wall step coverage than along a direction of poor side-wall step coverage. This is done to increase the overall strength of the anchor system when a metal deposition process that provides better side-wall step coverage in one direction than another direction is used to fabricate the anchors.

Other objects and features of the present invention will become apparent from consideration of the following description taken in conjunction with the accompanying drawings.

BRIEF DESCRIPTION OF THE DRAWINGS

FIG. 1A shows a top view of a MEMS air-bridge structure according to an embodiment of the present invention, in which a beam is supported at two ends by multiple anchor attachments.

FIG. 1B shows a cross-sectional view of the MEMS structure of FIG. 1A taken along line segment 1B–1B'.

FIG. 1C shows a cross-sectional view of the MEMS structure of FIG. 1A taken along line segment 1C–1C'.

FIG. 3A shows a top view of a MEMS structure according to an embodiment of the present invention, in which a beam is supported at one end by multiple anchor attachments and is free at the other end.

FIG. 3B shows a cross-sectional view of the MEMS structure of FIG. 3A taken along line segment 3B–3B'.

FIG. 3C shows a cross-sectional view of the MEMS structure of FIG. 3A taken along line segment 3C–3C'.

FIG. 5 shows a top view and two cross-sectional views of a traditional MEMS structure, wherein one of the cross-sectional views shows the MEMS structure under electrostatic actuation.

DETAILED DESCRIPTION OF THE PREFERRED EMBODIMENTS

Figure 2A:
FIG. 2 shows an exemplary process flow for the MEMS air-bridge structure according to an embodiment of the present invention.
Figure 2B:
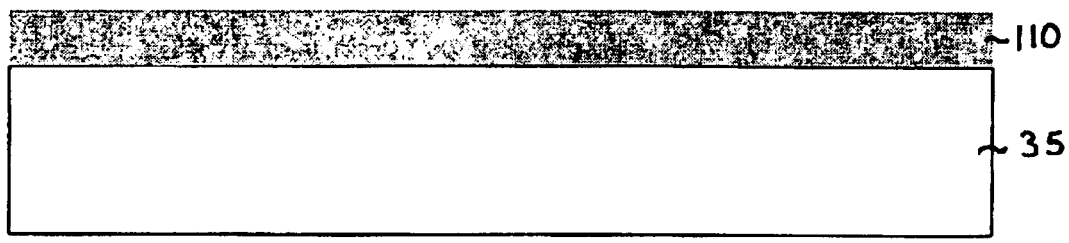
Figure 2C:
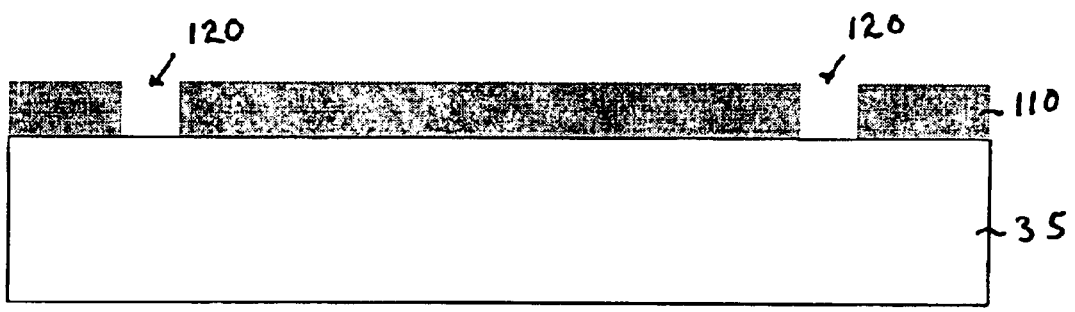
Figure 2D:
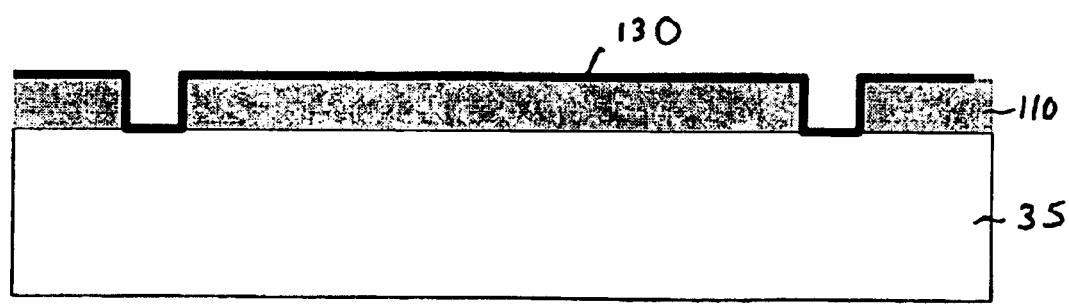
Figure 2E:
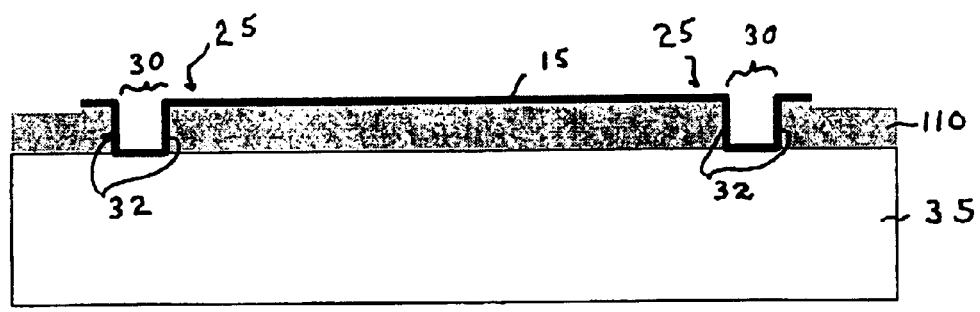
Figure 2F:
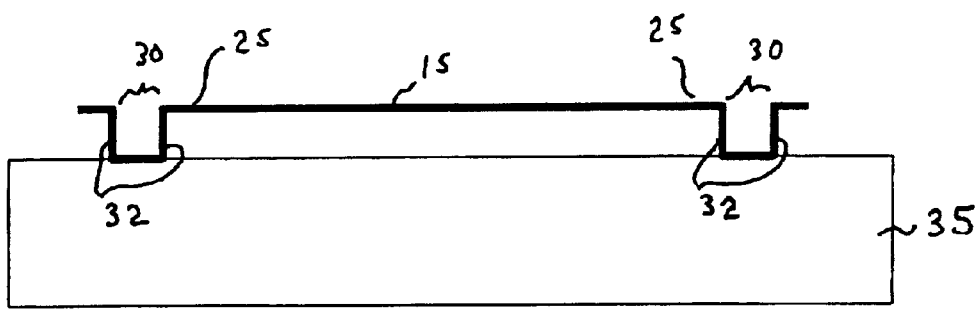

Referring to FIGS. 1A–1C, a MEMS air-bridge structure 10 comprises a flexible beam 15 ("top electrode") suspended above a substrate 35 is shown. The beam 15 is preferably made of a metal characterized by excellent flexibility, a high electrical conductivity and ease of fib deposition. Suitable metals for the beam 15 include, but are not limited to, gold and silver. Other materials such as polysilicon may also be used. The beam 15 is attached at each end to a rectangular base 25. Each base 25 is supported above the substrate 35 by multiple micro-staple anchors 30 attached to the surface of the substrate 35. Each micro-staple anchor 30 comprises anchor legs 32 along its four sides that support the base 25 off of the substrate 30. The anchors 30 are located away from an interface 45 between the beam 15 and each base 25. The significance of this will be explained later.

The MEMS air-bridge structure 10 can be used to realize a MEMS RF switch by including a bottom electrode 40 on the substrate 35 underneath the central portion of the beam 15. The RF switch is open in an "off" state and closed in an "on" state. In the "off" state, the RF switch is open by virtue of a gap formed between the beam 15 and the bottom electrode 40 on the substrate 35. In the "on" state, a voltage bias is applied to the RF switch to establish an electrostatic force that bends the central portion of the beam 15 down to make contact with the bottom electrode 40, thereby closing the switch. To obtain a high Q factor for the RF switch, the top electrode 15 and/or the bottom electrode 40 may be made of a thin-film High Temperature Superconductor (HTS) material on a MgO substrate. Thin-film HTS materials are now routinely formed and are commercially available. See, e.g., R. B. Hammond, et al., "Epitaxial Tl$_2$Ca$_1$Ba$_2$Cu$_2$O$_8$ Thin Films With Low 9.6 GHz Surface Resistance at High Power and Above 77K", Appl. Phy. Lett., Vol. 57, pp. 825–27, 1990.

FIG. 2 shows an exemplary manufacturing process flow for the MEMS air-bridge structure 10 according to an embodiment of the invention. For ease of discussion, the bottom electrode is omitted. In step (a), a substrate 35 is provided. The substrate may be made of, but is not limited to, MgO or silicon. In step (b), a sacrifical layer 110 is deposited onto the substrate 35. The sacrificial layer 110 may be any suitable material, e.g., a photoresist, a polyimide or an oxide. The sacrificial layer 110 provides support for the beam 15 and the associated base 25 during fabrication. In step (c), the sacrificial layer 110 is patterned to form vias 120 in the sacrificial layer 110 that expose the surface of the substrate 35. In step (d), a metal layer 130 is deposited onto the sacrificial layer 110 and the vias 120. The metal layer 130 may be deposited using electroplating, sputtering, or e-beam deposition. In step (e), the metal layer 130 is patterned to form the beam 15, the base 25 attached to each end of the beam 15, and the anchors 30. In step (f), the sacrificial layer 110 is removed to release the beam 15 using suitable means, such as, e.g., etching.

In FIG. 2, the metal deposited onto the vertical side-walls of the vias 120 form the anchor legs 32 of the anchors 30. FIG. 2 shows an ideal case in which the anchor legs 32 of the anchors 30 have the same thickness as the bases 25 and the beam 15. In practice, however, many metal deposition techniques, e.g., e-beam deposition and sputtering, provide better step coverage over horizontal surfaces than over vertical or high angled surfaces. As a result, the thickness of the anchor legs 32 can be significantly thinner than the thickness of the bases 25 and the beam 15.

For some metal deposition techniques, vertical side-wall step coverage is typically more effective in one direction than in other directions. In the example shown in FIGS. 1A–C, the side-wall step coverage is more effective in direction B than in direction C (indicated by arrows B and C in FIG. 1A). The cross-section taken along line segment 1C–1C' in FIG. 1C shows the cross section of the anchor legs 32 orientated along direction B. FIG. 1C shows that the anchor legs 32 orientated along direction B have relatively good step coverage. The cross-section taken along line segment 1B–1B' in FIG. 1B shows the cross section of the anchor legs 32 orientated along direction C. FIG. 1B shows that the anchor legs 32 orientated along direction C have relatively poor step coverage. As a result, the anchor legs 32 orientated along direction B are thicker, and therefore stronger, than the anchor legs 32 orientated along direction C in this particular example.

To increase the overall strength of the anchors 30, the invention makes the lengths, $l_B$, of the anchor legs 32 along the direction of good side-wall step coverage (direction B) longer than the lengths, lc, of the anchor legs 32 along the direction of poor side-wall step coverage (direction C). This way, the lengths of the anchor legs 32 along the direction of good side-wall step coverage are maximized while the lengths of the anchor legs 32 along the direction of poor side-wall coverage are minimized. Preferably, the lengths of the anchor legs 32 along the direction of good side-wall step coverage is at least twice the lengths of the anchor legs 32 along the direction of poor side-wall step coverage.

The multiple anchors according to the present invention offers several advantages over the traditional anchor system that maximizes the "footprint" area of the anchor. One advantage is that the combined length of the anchor legs 32 of the anchors 30 can be significantly greater along a direction of good side-wall step coverage than a traditional large anchor occupying the same area. In FIG. 1A, for example, the combined length of the anchors legs 32 for each base 25 along the direction of good step coverage (direction B) is found by adding the lengths of all the anchor legs 32 orientated along direction B. In this case, the combined length of the anchors legs 30 for each base 25 along the direction of good side-wall step coverage (direction B) is 18 $l_B$. By comparison, the combined length of the anchor legs of a single traditional large anchor occupying the same area as the multiple anchors 30 for one base 25 would be only approximately, 2 $l_B$, along direction B. As a result, the combined strength of the multiple anchors 30 according to the invention can be significantly greater than the strength of a traditional large anchor without requiring a larger base area than the traditional anchor. This can be especially advantageous when a metal deposition process that provides better side-wall step coverage along one direction than another direction is used to fabricate the anchors 30.

Figure 4:
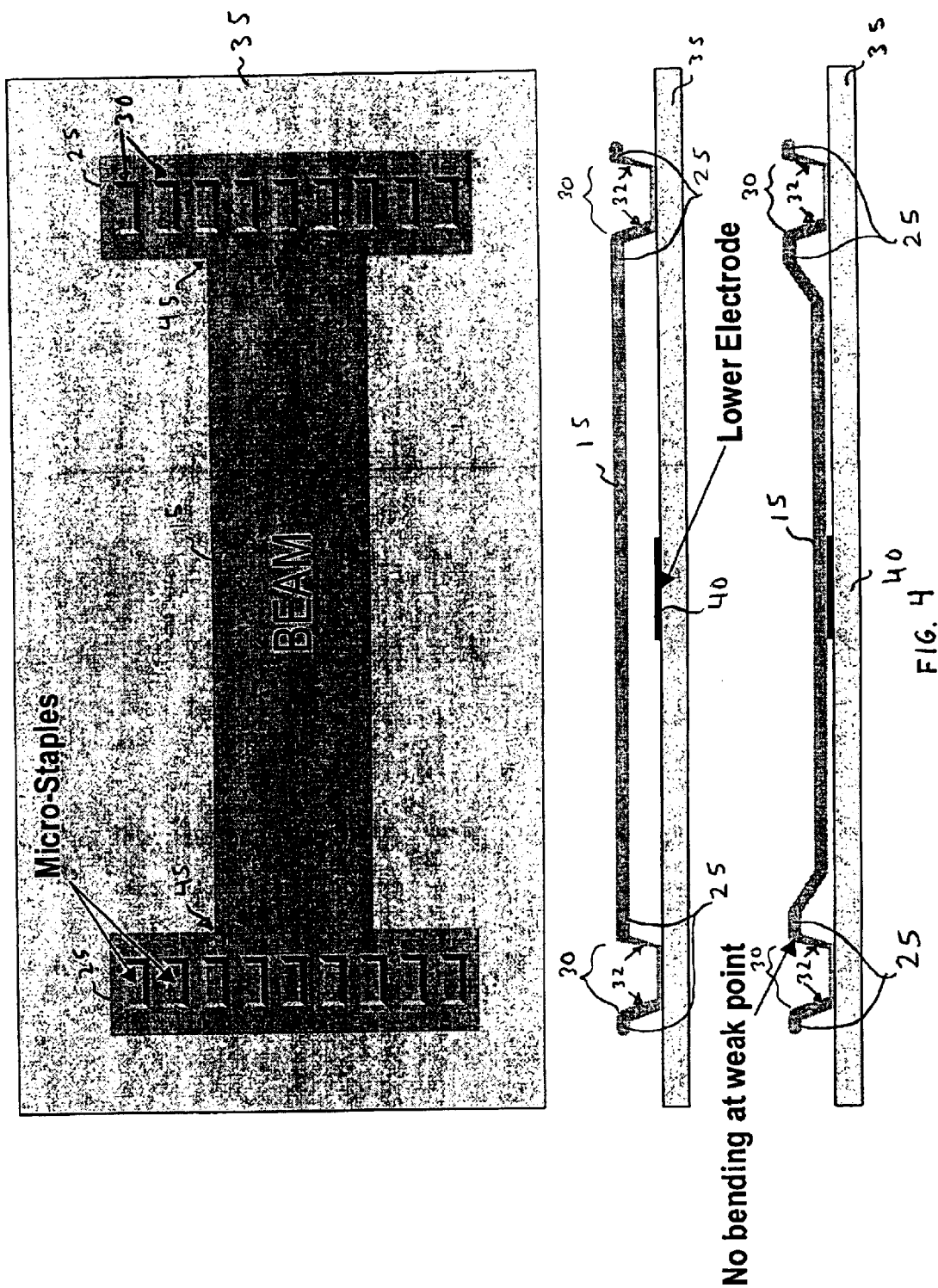
FIG. 4 shows a top view and two cross-sectional views of a MEMS structure according to one embodiment of the present invention, wherein one of the cross-sectional views shows the MEMS structure under electrostatic actuation.

Another advantage of the invention is that the anchors 30 are located away from the interface 45 between the beam 15 and the bases 25. This is important because the transition regions between the anchor legs 32 and the bases 25 form weak points in the anchors 30 that are vulnerable to mechanical failure. Because the anchors 30 of the invention are located away from the interface 45 between the beam 15 and the bases 25, stress due to bending or flexing of the beam 15 does not occur at the weak points of the anchors 30, but rather is concentrated at the interface 45 between the beam 15 and the base 25. This phenomenon is illustrated in FIG. 4, which shows the MEMS structure 10 according to the invention under electrostatic actuation. The electrostatic actuation bends the beam 15 down to make contact with the bottom electrode 40. Stress due to the bending of the beam 15 occurs at the interface 45 between the beam 15 and the bases 25, and away from the weak points of the anchors 30. In contrast, FIG. 5 shows a traditional anchor 80 in which the weak point of the anchor 80 is attached to the beam 15. In this case, stress due to bending of the beam 15 occurs at the weak point of the traditional anchor 80, which aggravates the weak point of the anchor 80 and increases the likelihood of mechanical failure. In the invention, however, the stress due to bending of the beam 15 occurs away from the anchors 30 so that the weak points of the anchors are not affected by the bending of the beam 15. This reduces the stress on the anchors 30, thereby improving the reliability of the MEMS structure 10.

Still another advantage of the invention is that a fracture in one of the anchors 30 does not propagate to the other anchors 30. This is because the anchors 30 are spaced apart form each other. Thus, if one of the anchors 30 fails due to a fracture, the other anchors 30 are unaffected. In the traditional large anchor, on the other hand, a fracture in the anchor can propagate along the length of the anchor causing failure of the entire anchor system.

The beam 15 can also be anchored at only one end with the other end free. Specifically, referring to FIGS. 3A–3C, a MEMS structure 70 can be used to realize a MEMS RF switch by including a bottom electrode 40 on the substrate 35 underneath the tip (i.e., free end) of the beam 15. In the "off" state, the RF switch is open by virtue of a gap formed between the beam 15 and the bottom electrode 40. In the "on" state, a voltage bias is applied to the RF switch to establish an electrostatic force that bends the tip of the beam 15 down to make contact with the bottom electrode 40, thereby closing the switch. The MEMS structure 70 of FIGS. 3A–3C can also be used to realize a variable MEMS capacitor by including a fixed bottom electrode 40 on the substrate 35 underneath the beam 15. Although the beam 15 is shown as being straight in FIG. 3B, the beam of a variable MEMS capacitor is typically, but not necessarily, curved upwardly from the anchored end. In operation, the capacitance of the variable MEMS capacitor is varied by varying a bias voltage applied to the capacitor. The applied bias voltage establishes an electrostatic force on the beam 15 that bends the beam 15 relative to the bottom electrode 40 on the substrate 35, thereby varying the gap between the beam 15 and the bottom electrode 40. This in turn varies the capacitance of the MEMS capacitor.

Six exemplary anchor arrangements according to the invention are illustrated in FIG. 6(a)–6(f), which show top views of bases 150 supported by the six anchor arrangements. Each base 150 is attached to a beam 155 by a folded spring 160. Folded springs are typically used for making beams easier to bend so that less electrostatic actuation is needed to pull the beams down. Those skilled in the art will appreciate that the folded springs 160 are optional and that the beams 155 may be directly attached to the bases 150.

Figure 6A:
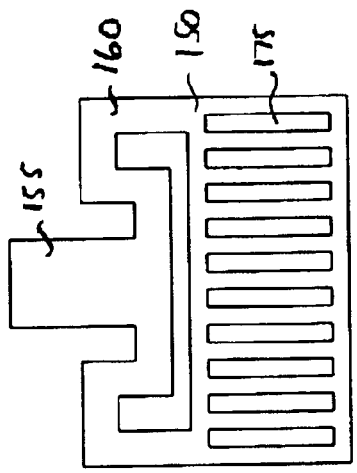
FIGS. 6($a$)–6($f$) show the top view of bases supported by six anchor arrangements according to the present invention.

FIG. 6(a) shows a top view of one anchor arrangement, in which the base 150 is supported by closely spaced multiple square anchors 165. The combined length, and thus, the combined strength, of the anchor legs of the square anchors 165 can be significantly greater than a traditional single large anchor occupying the same base area as the square anchors 165. The anchor arrangement shown in FIG. 6(a) may be used for a metal deposition process that provides uniform side-wall step coverage.

Figure 6B:
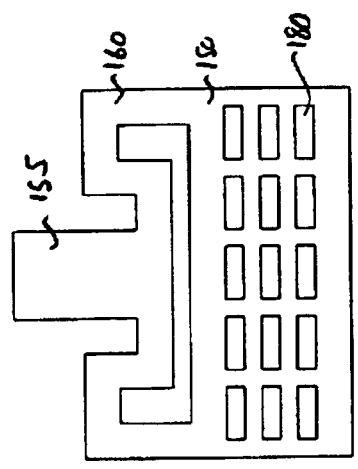
Figure 6C:
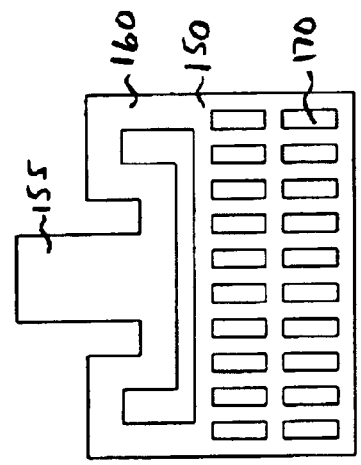

FIG. 6(b) shows a top view of another anchor arrangement, in which the beam base 150 is supported by two rows of rectangular anchors 170. The anchor legs of each anchor 170 are made longer in the horizontal direction than in the vertical direction (with respect to the top view). This anchor arrangement increases the strength of the anchors 170 for deposition processes that provide better side-wall step coverage in the vertical direction than in the horizontal direction. FIG. 6(c) shows the anchor arrangement comprising a single row of longer rectangular anchors 175.

Figure 6D:
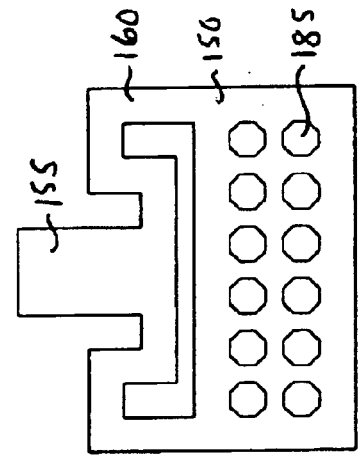
Figure 6E:
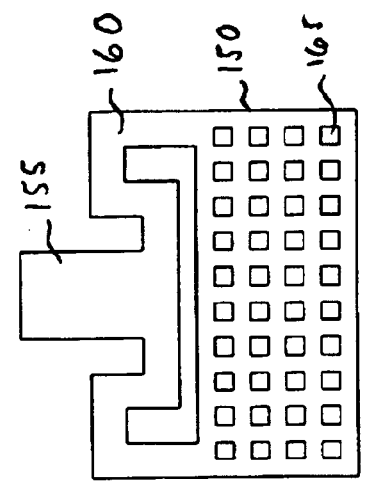
Figure 6F:
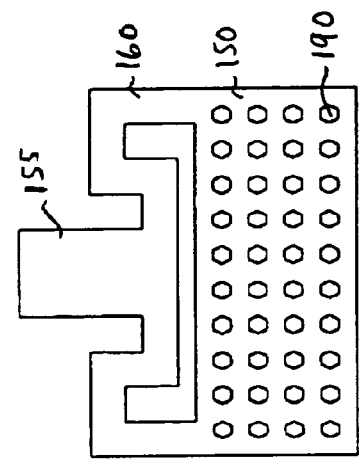

FIG. 6(f) shows a top view of still another anchor arrangement, in which the base 150 is supported by three rows of rectangular anchors 180. The anchor legs of each anchor 180 are made longer in the horizontal direction than in the vertical direction (with respect to the top view). This anchor arrangement increases the strength of the anchors 180 for deposition 5 processes that provide better side-wall step coverage in the horizontal direction than in the vertical direction.

FIG. 6(d) shows an anchor arrangement comprising three rows of hexagonal anchors 190 and FIG. 6(e) shows an anchor arrangement comprising two rows of octagonal anchors 185.

FIGS. 6(a)–6(f) illustrate exemplary anchor arrangements built in accordance with the present invention and are not intended to be exhaustive. Those skilled in art will appreciate that the anchor arrangements shown in the FIGS. 6(a)–6(f) may include any number of anchors and any number of rows.

Figure 7C:
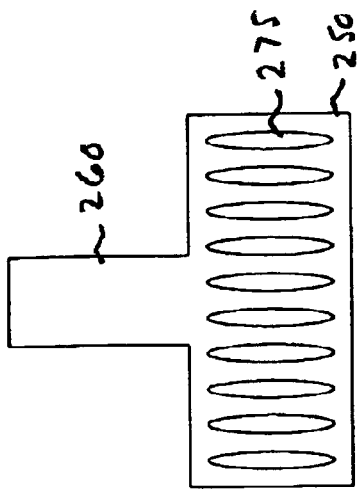
FIGS. 7($a$)–7($f$) show the top view of bases supported by six more anchor arrangements according to the present invention.
Figure 7B:
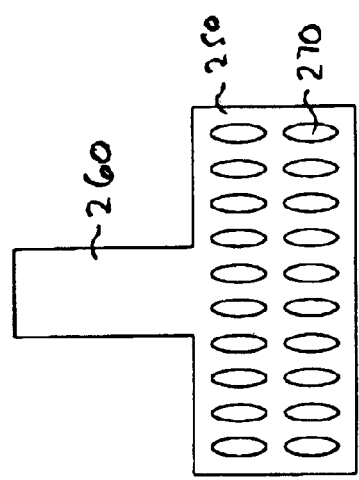
Figure 7A:
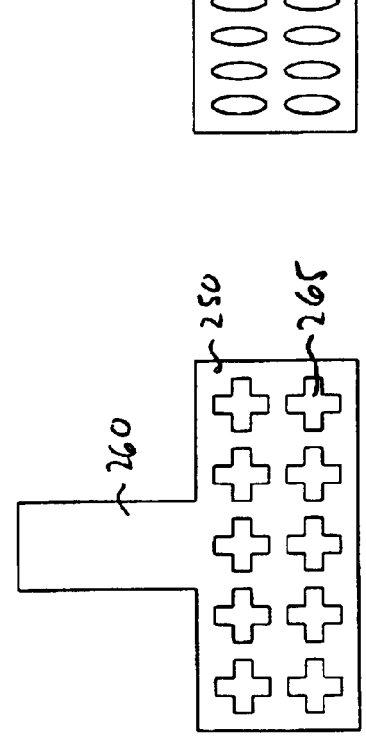
Figure 7F:
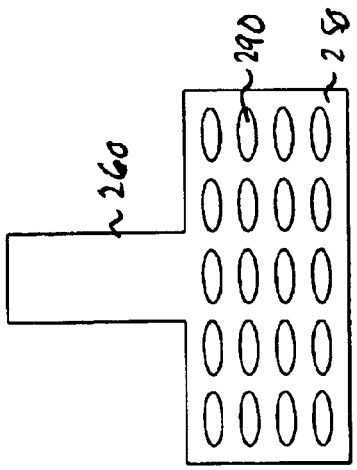
Figure 7E:
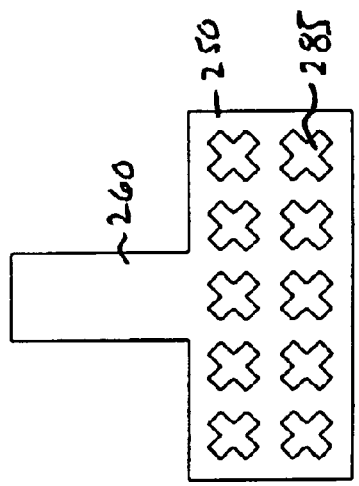
Figure 7D:
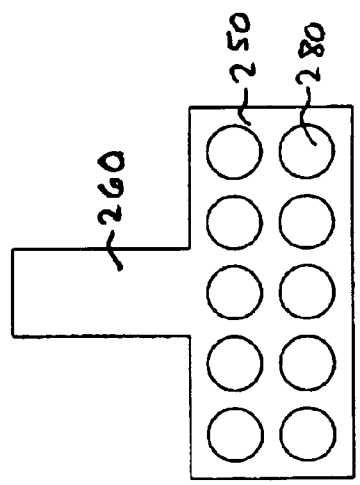

Six more exemplary anchor arrangements according to the invention are illustrated in FIG. 7(a)–7(f), which show top views of bases 250 supported by the six anchor arrangements. Each base 250 is attached directly to a beam 260. Those skilled in the art will appreciate that each beam 260 may also be attached to the base 250 using a folded spring. FIG. 7(a) shows an anchor arrangement comprising two rows of cross anchors 265. FIG. 7(b) shows an anchor arrangement comprising two rows of small elliptical anchors 270. FIG. 7(c) shows an anchor arrangement comprising one row of long elliptical anchors 275. FIG. 7(d) shows an anchor arrangement comprising two rows of circular anchors 280. The circular and elliptical anchors have an advantage of minimizing stress concentration points that may otherwise occur on corners along the perimeter of the anchor. FIG. 7(e) shows an anchor arrangement comprising two rows of diagonal cross anchors 285. FIG. 7(f) shows a anchor arrangement comprising three rows of wide elliptical anchors 290.

While various embodiments of the application have been described, it will be apparent to those of ordinary skill in the art that many embodiments and implementations are possible that are within the scope of the present invention. For instance, the multiple anchor system according to the present invention is not limited to the MEMS devices described in the specification and may, in principle, be used to secure other MEMS devices to a substrate. For example, the anchor system according to the invention may be used to anchor a variety of MEMS actuator devices, including thermal actuators, magnetic actuators, comb drive actuators, RF and DC switches, RF and DC relays, and variable capacitors (varactors). In addition, the anchor system according to the invention may be used to anchor a variety of MEMS sensor devices including capacitive sensors, resonant sensors, and accelerometers. Therefore, the invention is not to be restricted or limited except in accordance with the following claims and their equivalents.

What is claimed is:

1. A MEMS anchor system for securing a base of a MEMS device to a substrate, comprising:

a plurality of anchors securing the base of the MEMS device to the substrate, each anchor comprising a plurality of anchor legs, each anchor leg being attached at one end to the base of the MEMS device and attached at another end to the substrate, the plurality of anchor legs comprising a first number of anchor legs oriented along a first direction and a second number of anchor legs oriented along a second direction, the first number of anchor legs are stronger and longer than the second number of anchor legs.

2. The MEMS anchor system of claim 1, wherein the first number of anchor legs orientated along the first direction have lengths that are at least twice the lengths of the second number of anchor legs orientated along the second direction.

3. The MEMS anchor system of claim 1, wherein the plurality of anchors are arranged in at least two rows, each row comprising at least two anchors.

4. The MEMS anchor system of claim 3, wherein each row comprises at least four anchors.

5. The MEMS anchor system of claim 1, wherein the plurality of anchors comprises at least eight anchors.

6. A MEMS apparatus, comprising:

a beam;

a base attached to one end of the beam;

a substrate; and a plurality of anchors securing the base to the substrate, each anchor comprising a plurality of anchor legs, each anchor leg being attached at one end to the base of the MEMS device and attached at another end to the substrate, the plurality of anchor legs comprising a first number of anchor legs oriented along a first direction and a second number of anchor legs oriented along a second direction, the first number of anchor legs are stronger and longer than the second number of anchor legs.

7. The MEMS apparatus of claim 6, wherein the plurality of anchors is located away from the end of the beam attached to the base.

8. The MEMS apparatus of claim 6, wherein the width of the base is greater than the width of the beam.

9. The MEMS anchor system of claim 6, wherein the first number of anchor legs orientated along the first direction have lengths that are at least twice the length of the second number of anchor legs orientated along the second direction.

10. The MEMS apparatus of claim 6, wherein the plurality of anchors are arranged in at least two rows, each row comprising at least two anchors.

11. The MEMS apparatus of claim 10, wherein each row comprises at least four anchors.

12. The MEMS apparatus of claim 6, wherein the plurality of anchors comprises at least eight anchors.

13. The MEMS apparatus of claim 6, further comprising a folded spring attaching the one end of the beam to the base.

14. The MEMS apparatus of claim 6, wherein the other end of the beam is free.

15. A MEMS apparatus, comprising:
a beam;
two bases, each base attached to one end of the beam;
a substrate; and
two sets of multiple anchors, each set of multiple anchors securing one of the two bases to the substrate, each anchor of the sets of multiple anchors comprising a plurality of anchor legs, wherein in a first set of multiple anchors, each anchor leg is attached at one end to a first base of the MEMS device and attached at another end to the substrate, and wherein in a second set of multiple anchors, each anchor leg is attached at one end to a second base of the MEMS device and attached at another end to the substrate, the plurality of anchor legs of the first and second sets of multiple anchors comprising a first number of anchor legs oriented along a first direction and a second number of anchor legs oriented along a second directions the first number of anchor legs are stronger and longer than the second number of anchor legs.

16. The MEMS apparatus of claim 15, wherein each set of multiple anchors is located away from the end of the beam attached to the respective base.

17. The MEMS apparatus of claim 15, wherein the width of each one of the bases is greater than the width of the beam.

18. The MEMS anchor system of claim 15, wherein the first number of anchor legs orientated along the first direction have lengths that are at least twice the length of the second number of anchor legs orientated along the second direction.

19. The MEMS apparatus of claim 15, wherein each set of multiple anchors is arranged in at least two rows of anchors, each row comprising at least two anchors.

20. The MEMS apparatus of claim 19, wherein each row comprises at least four anchors.

21. The MEMS apparatus of claim 15, wherein each set of multiple anchors comprises at least eight anchors.

22. The MEMS apparatus of claim 15, further comprising a folded spring attaching one end of the beam to one of the two bases.

23. A MEMS anchor system for securing a base of a MEMS device to a substrate, comprising:
a plurality of anchors securing the base of the MEMS device to the substrate, each anchor further comprising a plurality of anchor legs, each anchor leg being attached at one end to the base of the MEMS device and attached at another end to the substrate, wherein the plurality of anchor legs comprises a first number of anchor legs that are orientated along a first direction, a second number of anchor legs that are orientated along a second direction, and the first number of anchor legs are thicker and longer than the second number of anchor legs.

24. The MEMS anchor system of claim 23, wherein the first number of anchor legs are oriented parallel to the direction of the beam.

25. The MEMS anchor system of claim 23, wherein the first number of anchor legs are oriented perpendicular to the direction of the beam.

* * * * *